United States Patent
Rofougaran et al.

(10) Patent No.: US 10,938,347 B2
(45) Date of Patent: Mar. 2, 2021

(54) OUTPHASING POWER COMBINER

(71) Applicant: Movandi Corporation, Irvine, CA (US)

(72) Inventors: Ahmadreza Rofougaran, Newport Beach, CA (US); Maryam Rofougaran, Rancho Palos Verdes, CA (US); Sam Gharavi, Irvine, CA (US)

(73) Assignee: SILICON VALLEY BANK, Santa Clara, CA (US)

(*) Notice: Subject to any disclaimer, the term of this patent is extended or adjusted under 35 U.S.C. 154(b) by 0 days.

(21) Appl. No.: 16/449,514

(22) Filed: Jun. 24, 2019

(65) Prior Publication Data
US 2020/0403573 A1 Dec. 24, 2020

(51) Int. Cl.
*H03F 1/02* (2006.01)
*H03F 3/24* (2006.01)
*H04B 1/04* (2006.01)

(52) U.S. Cl.
CPC .............. *H03F 1/02* (2013.01); *H03F 3/245* (2013.01); *H04B 1/04* (2013.01); *H03F 2200/105* (2013.01); *H03F 2200/222* (2013.01); *H03F 2200/451* (2013.01); *H03F 2200/459* (2013.01); *H04B 2001/045* (2013.01)

(58) Field of Classification Search
CPC ...... H03F 1/02; H03F 3/245; H03F 2200/105; H03F 2200/222; H03F 2200/451; H03F 2200/459; H04B 1/04; H04B 2001/045
See application file for complete search history.

(56) References Cited

U.S. PATENT DOCUMENTS

| | | | | |
|---|---|---|---|---|
| 8,451,053 | B2* | 5/2013 | Perreault | H03F 1/0294 330/124 R |
| 9,141,832 | B2* | 9/2015 | Perreault | H03F 1/0294 |
| 9,935,663 | B1* | 4/2018 | Rofougaran | H04B 1/0483 |
| 10,171,115 | B1* | 1/2019 | Shirinfar | H04B 17/12 |
| 2008/0079496 | A1* | 4/2008 | Thompson | H03F 1/565 330/301 |
| 2008/0225559 | A1* | 9/2008 | Yanada | H02M 1/32 363/44 |
| 2016/0065051 | A1* | 3/2016 | Kuang | H05B 45/382 315/186 |

* cited by examiner

*Primary Examiner* — Nguyen T Vo
(74) *Attorney, Agent, or Firm* — Chip Law Group

(57) ABSTRACT

The outphasing power combiner circuit includes a transformer having a primary coil coupled to a first power amplifier (PA) and a second PA, and a secondary coil. The secondary coil supplies a current to an antenna based on a first direction of a first phase of a first amplified constant-envelope signal in the primary coil with respect to a second phase of a second amplified constant-envelope signal in the primary coil. The outphasing power combiner circuit further includes load impedance coupled between a median point of the primary coil and ground. The load impedance dissipates the current based on a second direction of the first phase of the first amplified constant-envelope signal in the primary coil with respect to the second phase of the second amplified constant-envelope signal in the primary coil, which results in improved power efficiency.

29 Claims, 5 Drawing Sheets

OUTPHASING POWER COMBINER

CROSS-REFERENCE TO RELATED APPLICATIONS/INCORPORATION BY REFERENCE

None.

FIELD OF TECHNOLOGY

Certain embodiments of the disclosure relate to outphasing wireless systems. More specifically, certain embodiments of the disclosure relate to an outphasing power combiner in a radio frequency (RF) transmitter.

BACKGROUND

Extensive use of wireless communication in various fields of application (for example home automation, cloud computing, Internet of Things applications, or the like) has led to the advent of high data-rate and bandwidth-efficient wireless communication standards (such as 802.11 Wireless LAN, cellular LTE, and 5G). Such wireless communication standards typically involve communication using RF signals that have time-varying amplitude (i.e., variable-envelope signals). Communication using such variable-envelope signals is more spectral efficient than communication using RF signals with constant amplitude (i.e., constant-envelope signals). However, the constant-envelope signals prove to be more power efficient than the variable-envelope signals. Hence, there exists a trade-off between power efficiency and spectral efficiency. Outphasing is a known solution to overcome the abovementioned problems, where linear amplification is achieved using non-linear components. Typically, in an outphasing wireless transmission system, a variable envelope signal is decomposed into two (or more) constant envelope signals with different phases. Such constant envelope signals may be amplified by separate power amplifiers in an RF transmitter.

In certain scenarios, the RF transmitter may further include a power combiner that combines the two amplified constant-envelope signals, and the combined signal may be then transmitted over the air by an antenna of the RF transmitter. In certain instances, when the power combiner is an isolating power combiner, such as a Wilkinson combiner, some power may be lost in a dummy load within the power combiner due to different phases of the two amplified constant-envelope signals. Alternatively, when the power combiner is a non-isolating (low-loss) power combiner, the power amplifiers that feed the power combiner may interfere with each other, thus reducing the linearity of the power amplifiers. The reduction in the linearity of the power amplifiers may increase the error vector magnitude (EVM) of the RF signal. In light of the foregoing, there is a requirement of an advanced outphasing power combiner that overcomes the abovementioned deficiencies.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY OF THE DISCLOSURE

An outphasing power combiner and a radio frequency (RF) transmitter system that includes the outphasing power combiner are provided, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION OF THE DISCLOSURE

Certain embodiments of the disclosure may be found in an outphasing power combiner and a radio frequency (RF) transmitter system that includes the outphasing power combiner. The disclosed outphasing power combiner in a RF transmitter provides an improved power efficiency in comparison to the conventional power combiners that utilize a dummy load. In portable device applications (such as in cell phones, or the like), a higher power efficiency may result in longer battery life and/or smaller battery size. Reduction in the battery size may in turn result in a reduction in the size of the portable devices. Moreover, the outphasing power combiner may find application in a repeater device to improve the power efficiency. The disclosed outphasing power combiner may also function as an isolating power combiner. For example, two power amplifiers that feed the disclosed power combiner do not interfere with each other, resulting in higher linearity of the two power amplifiers than other power amplifiers in non-isolating power combiner. Such high linearity results in higher possible data rates and higher spectral and power efficiency, which is a desired need for the present (such as such as 802.11 Wireless LAN, cellular LTE, 5G-ready, and 5G communication (i.e. mmWave communication)) as well as for the future wireless communication (e.g. 6G, and the like). In the following description, reference is made to the accompanying drawings, which form a part hereof, and in which is shown, by way of illustration, various embodiments of the present disclosure.

Figure 1:
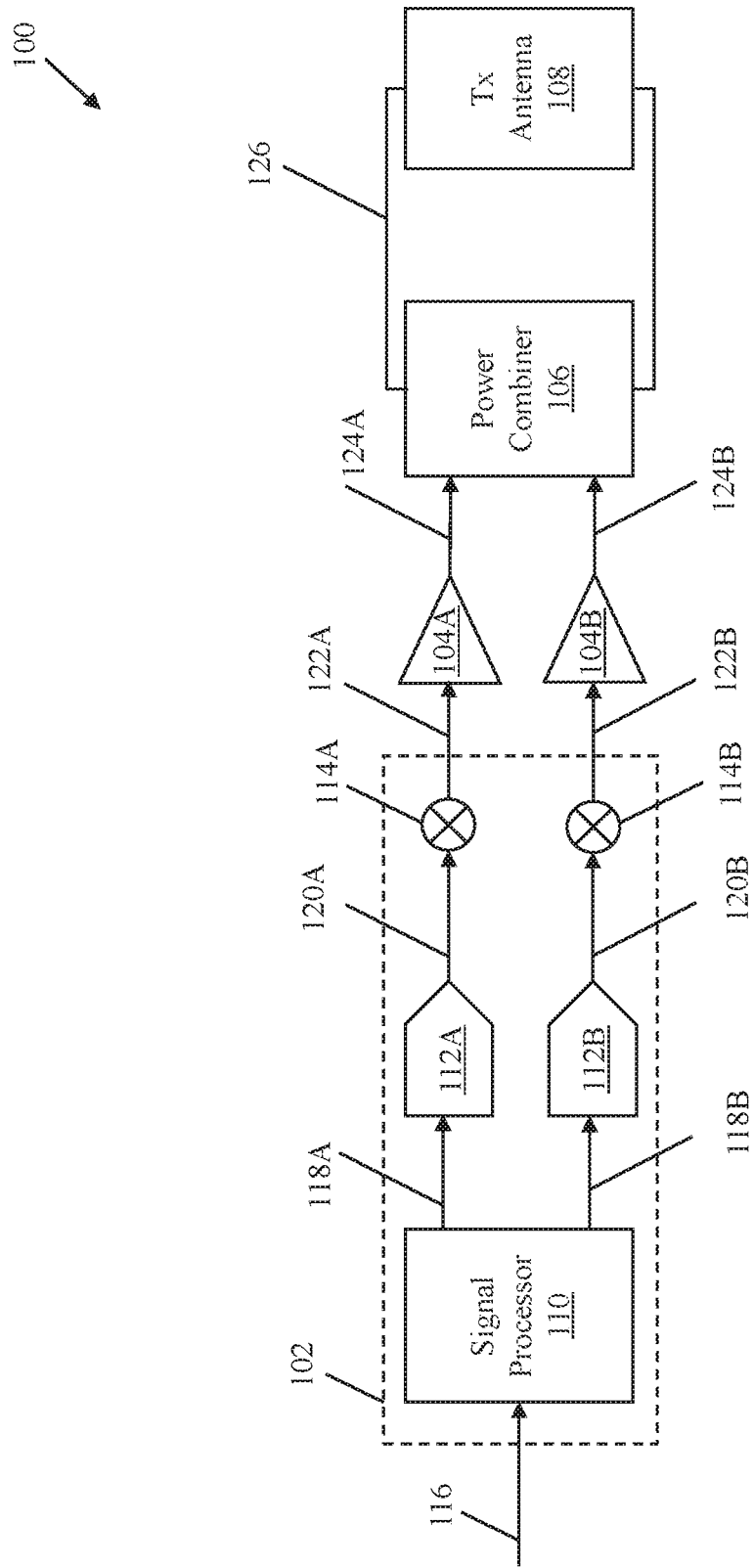
FIG. 1 illustrates an exemplary wireless system diagram of a portion of an exemplary outphasing radio frequency (RF) transmitter, in accordance with an exemplary embodiment of the disclosure.

FIG. 1 illustrates a wireless system diagram of a portion of an outphasing radio frequency (RF) transmitter (Tx), in accordance with an exemplary embodiment of the disclosure. With reference to FIG. 1, there is shown an outphasing RF Tx 100. The outphasing RF Tx 100 includes a signal decomposition block 102, a first power amplifier (PA) 104A, a second PA 104B, a power combiner 106, and a Tx antenna 108. The signal decomposition block 102 may include a signal processor 110, a first digital-to-analog converter (DAC) 112A, a second DAC 112B, a first mixer 114A, and a second mixer 114B. The signal decomposition block 102 may be coupled to the first PA 104A and the second PA 104B. The first PA 104A and the second PA 104B may be further coupled to the power combiner 106. The power combiner 106 may be further coupled to the Tx antenna 108. In the signal decomposition block 102, the signal processor 110 may be coupled to the first DAC 112A and the second DAC 112B. The first DAC 112A and the second DAC 112B may be further coupled to the first mixer 114A and the second mixer 114B, respectively.

The signal decomposition block 102 may be configured to receive a modulated input signal 116 from, for example a modem (not shown) during normal operation. The modulated input signal 116 may be an amplitude and phase modulated signal. In one example, the modulated input signal 116 is a variable amplitude signal, represented by equation (1) below:

$$S_{in}(t)=A_M*\sin(\omega t+\varphi(t)) \quad (1)$$

where, $S_{in}(t)$ represents the modulated input signal 116,
$A_M$ is the peak value of A(t) that represents the time-varying amplitude signal, and
$\varphi(t)$ represents outphasing angle.

In the signal decomposition block 102, the signal processor 110 may be configured to receive the modulated input signal 116 and decompose the received modulated input signal 116 into two constant amplitude digital signals 118A and 118B. The two constant amplitude digital signals 118A and 118B have a single constant amplitude level. The signal processor 110 may provide the two constant amplitude digital signals 118A and 118B to the first DAC 112A and the second DAC 112B, respectively.

The first DAC 112A and the second DAC 112B may be configured to convert the two constant amplitude digital signals 118A and 118B into two constant amplitude analog signals 120A and 120B, respectively. The first DAC 112A and the second DAC 112B may provide the two constant amplitude analog signals 120A and 120B to the first mixer 114A and the second mixer 114B, respectively.

The first mixer 114A and the second mixer 114B may be configured to up-convert the two constant amplitude analog signals 120A and 120B into two constant amplitude RF signals having corresponding phases in opposite direction (hereinafter, the two constant amplitude RF signals are referred to and designated as two constant-envelope signals 122A and 122B). The first mixer 114A and the second mixer 114B may provide the two constant-envelope signals 122A and 122B to the first PA 104A and the second PA 104B, respectively. The two constant-envelope signals 122A and 122B are represented as equations (2) and (3) below:

$$S_1(t)=A_M/2*\sin(\omega t+\varphi(t)+\psi(t)) \quad (2)$$

$$S_2(t)=A_M/2*\sin(\omega t+\varphi(t)-\psi(t)) \quad (3)$$

where $S_1(t)$ and $S_2(t)$ represent the two constant-envelope signals 122A and 122B, respectively,
$A_M$ is the peak value of A(t) that represents the time-varying amplitude, and
$\varphi(t)$ represents arc cos(A(t)).

The first PA 104A and the second PA 104B may be configured to amplify the two constant-envelope signals 122A and 122B and generate two amplified constant-envelope signals 124A and 124B, respectively. The first PA 104A and the second PA 104B may provide the two amplified constant-envelope signals 124A and 124B to the power combiner 106.

The power combiner 106 may be configured to reconstruct an output RF signal 126 based on a combination of the two amplified constant-envelope signals 124A and 124B, received from the first PA 104A and the second PA 104B, respectively. The combination may correspond to a sum (or a difference) of the two amplified constant-envelope signals 124A and 124B. In accordance with an embodiment, the combination of the two amplified constant-envelope signals 124A and 124B is represented as equation (4) below:

$$S_{out}(t)=S'_1(t)-S'_2(t)$$

$$=G\cos(\psi(t))\sin(\omega t+\varphi(t))$$

$$=GA(t)\sin(\omega t+\varphi(t)) \quad (4)$$

where, $S_{out}(t)$ represents the output RF signal 126,
$S'_1(t)$ represents the first amplified constant-envelope signal 124A,
$S'_2(t)$ represents the second amplified constant-envelope signal 124B, and
G represents gain of the first PA 104A and the second PA 104B.

Figure 2A:
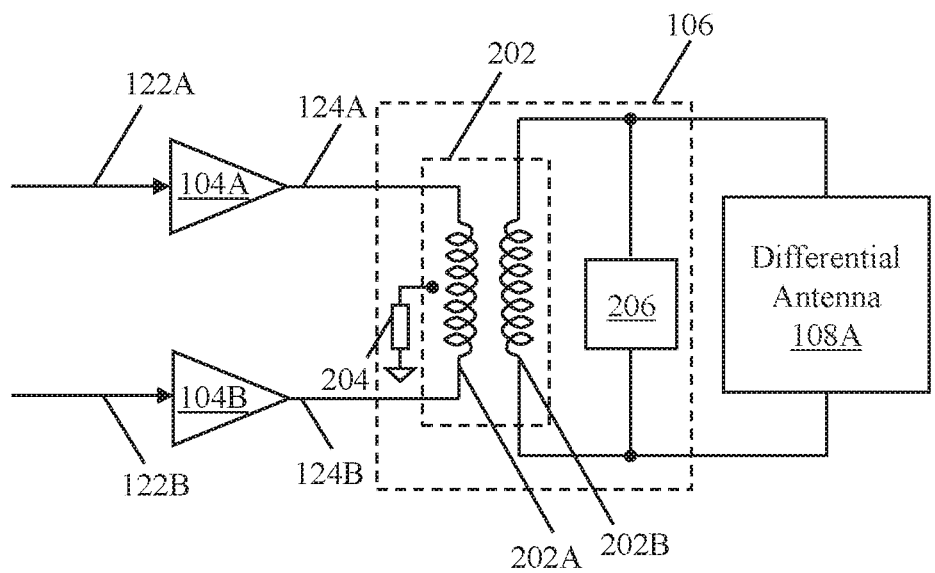
FIG. 2A illustrates a first exemplary embodiment of an outphasing power combiner, in accordance with an exemplary embodiment of the disclosure.
Figure 2B:
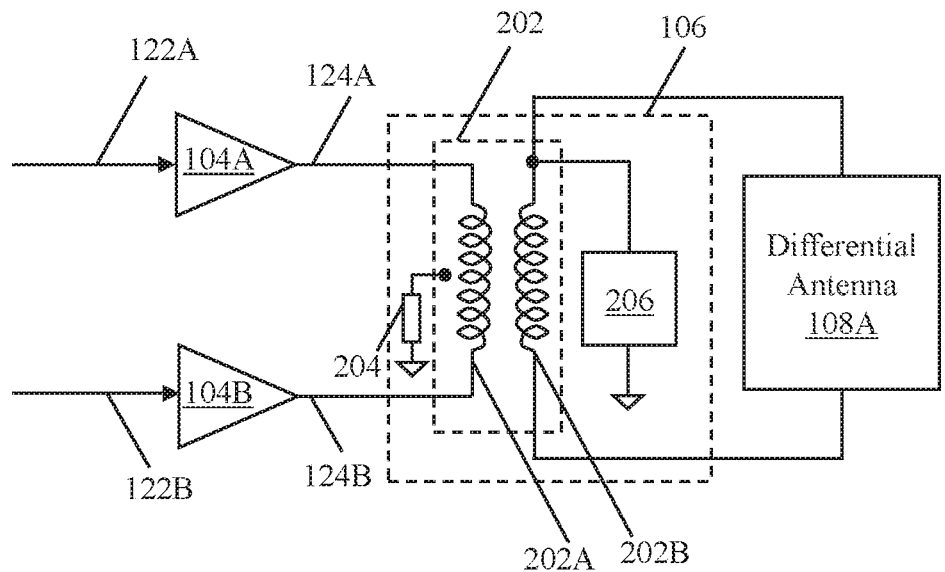
FIG. 2B illustrates a second exemplary embodiment of an outphasing power combiner, in accordance with an exemplary embodiment of the disclosure.
Figure 2C:
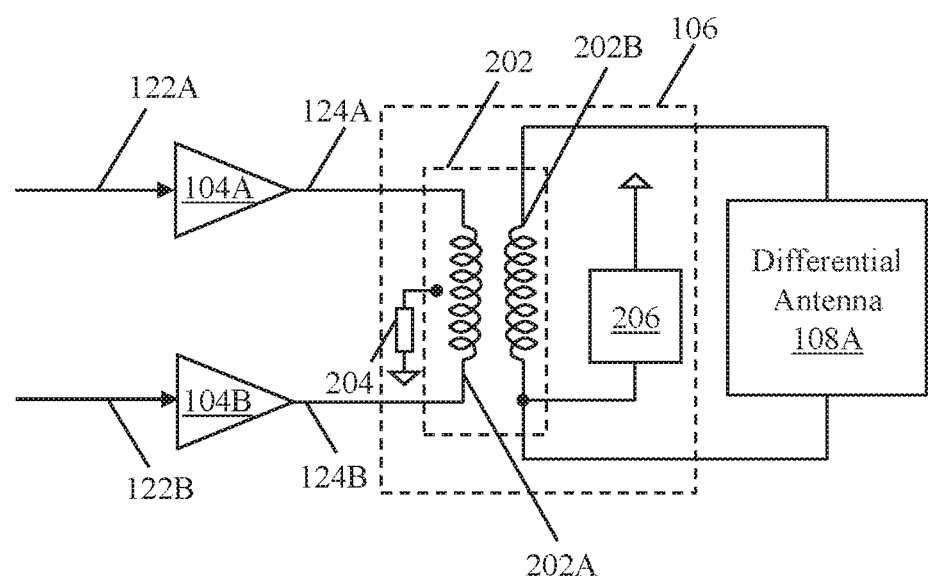
FIG. 2C illustrates a third exemplary embodiment of an outphasing power combiner, in accordance with an exemplary embodiment of the disclosure.
Figure 2D:
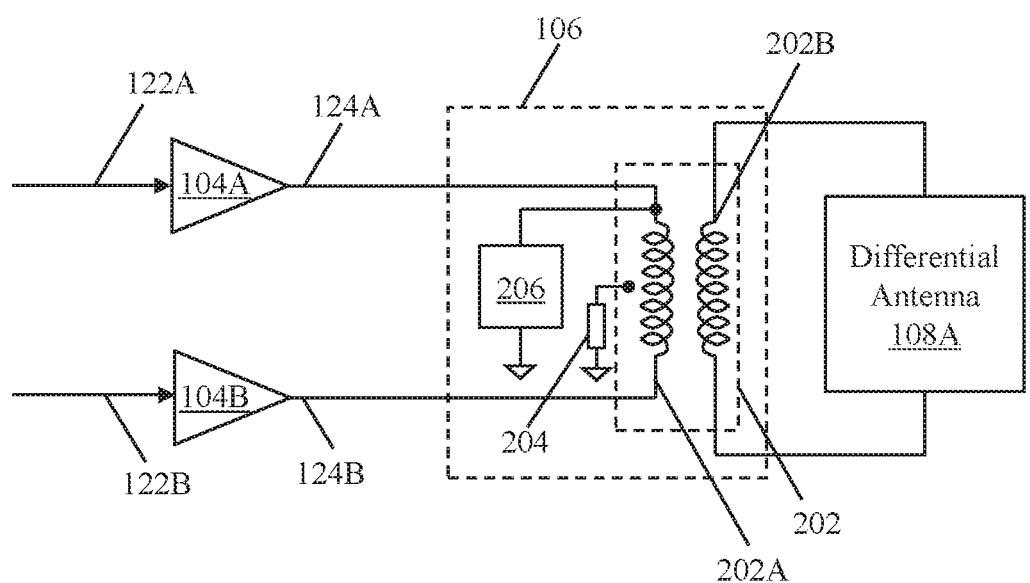
FIG. 2D illustrates a fourth exemplary embodiment of an outphasing power combiner, in accordance with an exemplary embodiment of the disclosure.
Figure 2E:
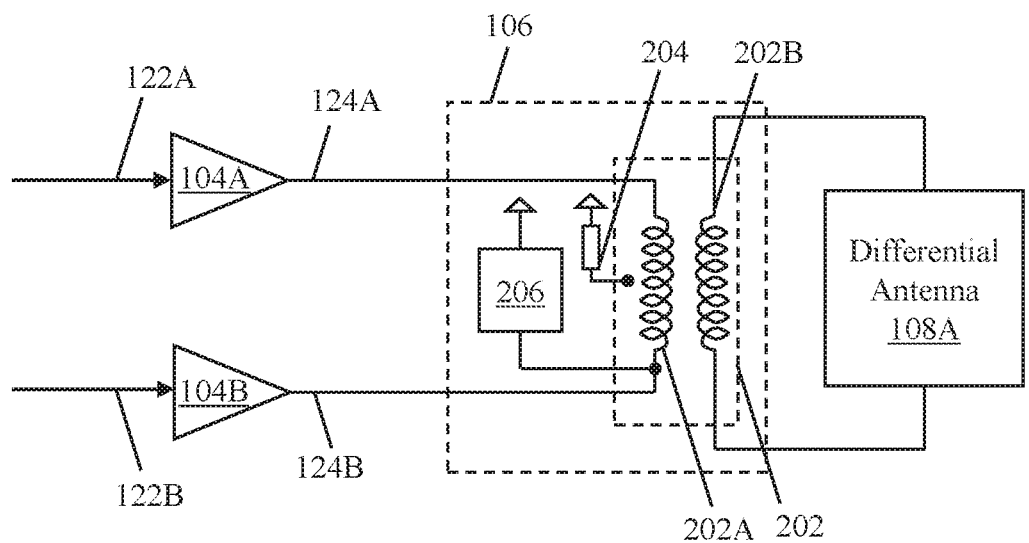
FIG. 2E illustrates a fifth exemplary embodiment of an outphasing power combiner, in accordance with an exemplary embodiment of the disclosure.
Figure 2F:
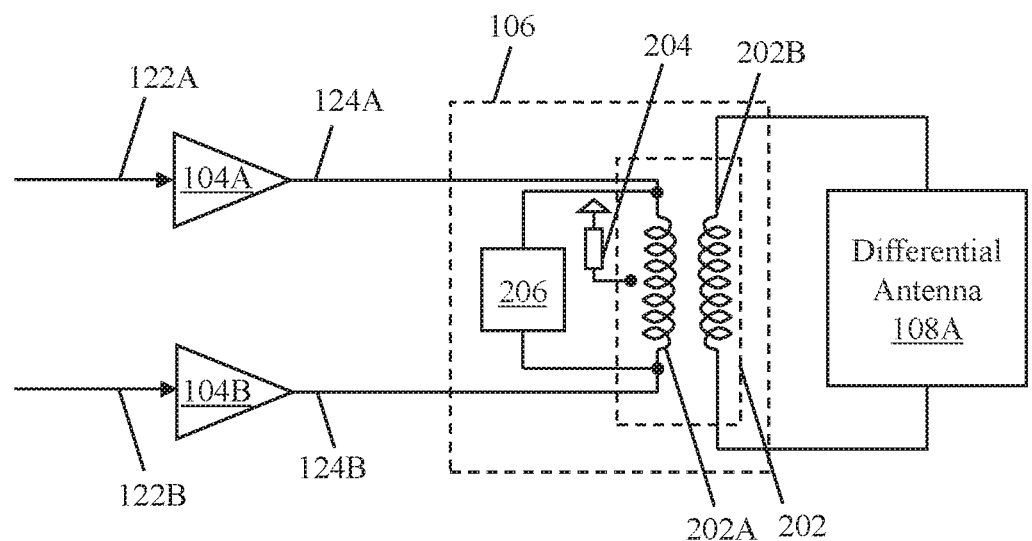
FIG. 2F illustrates a sixth exemplary embodiment of an outphasing power combiner, in accordance with an exemplary embodiment of the disclosure.
Figure 2G:
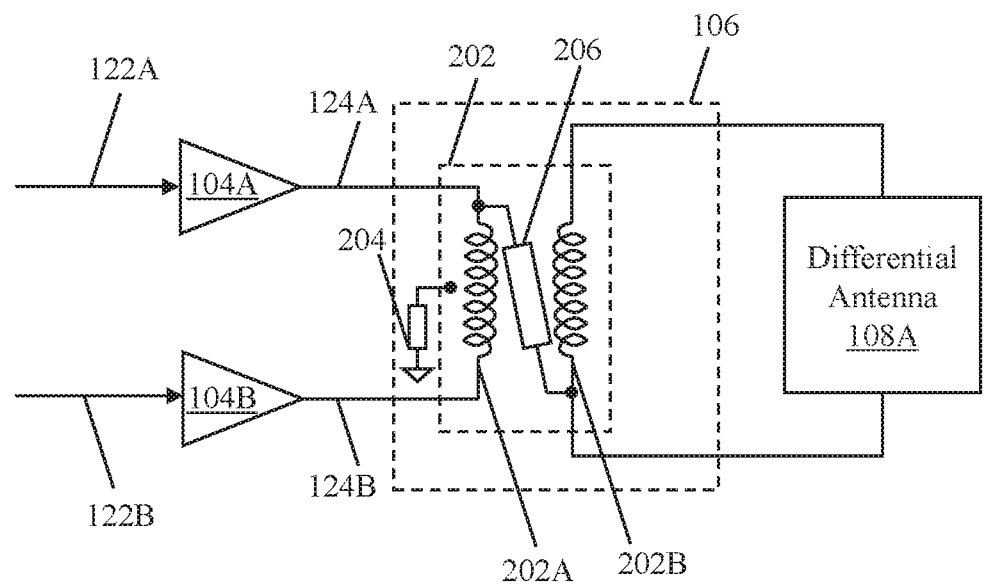
FIG. 2G illustrates a seventh exemplary embodiment of an outphasing power combiner, in accordance with an exemplary embodiment of the disclosure.
Figure 2H:
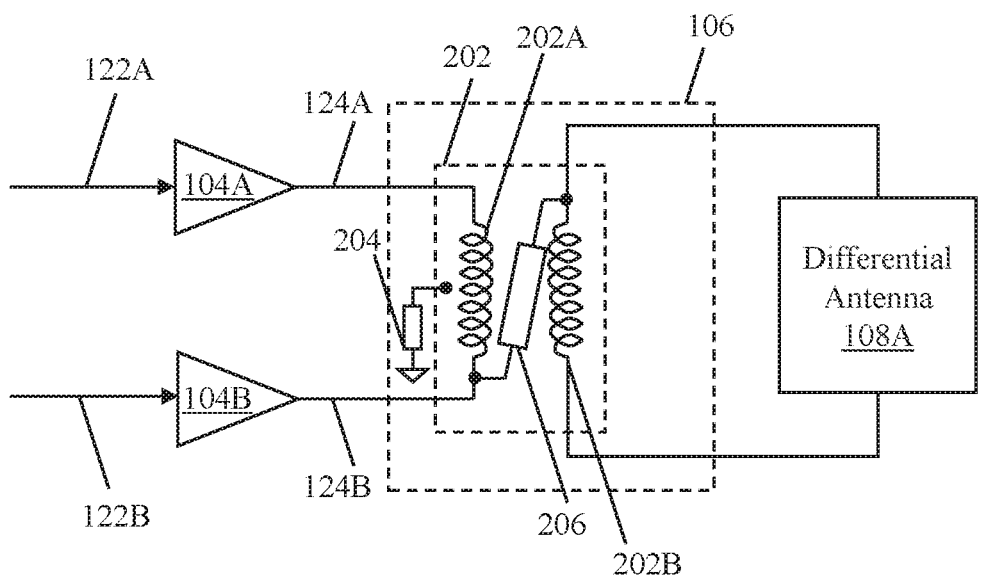
FIG. 2H illustrates an eighth exemplary embodiment of an outphasing power combiner, in accordance with an exemplary embodiment of the disclosure.

The power combiner 106 may be configured to match the impedances of the first PA 104A and the second PA 104B, and the Tx antenna 108. For such impedance matching, the power combiner 106 may utilize various components, such as a load impedance, a transformer, and a ripple detector, for example, a transmitter signal strength indicator (TSSI) or an envelope detector. A primary coil in the transformer may be utilized to induce current in a secondary coil for certain currents in the primary coil, generated by the first PA 104A and the second PA 104B based on the two amplified constant-envelope signals 124A and 124B, respectively. The ripple detector may be utilized to detect one or more ripples in envelopes of the two amplified constant-envelope signals 124A and 124B and the current induced in the secondary coil. Further, the load impedance may be utilized to dissipate other currents in the primary coil, generated by the first PA 104A and the second PA 104B based on the two amplified constant-envelope signals 124A and 124B. Various embodiments of the power combiner 106 have been described in detail in FIGS. 2A-2H. For example, in accordance with an embodiment as illustrated in FIG. 2A, the primary coil in the transformer may be utilized to induce current in the secondary coil for out-phase currents in the primary coil, generated by the first PA 104A and the second PA 104B based on the two amplified constant-envelope signals 124A and 124B. In such a case, the load impedance may be utilized to dissipate in-phase currents in the primary coil, generated by the first PA 104A and the second PA 104B based on the two amplified constant-envelope signals 124A and 124B. In accordance with an embodiment, the ripple detector may be coupled in parallel to the secondary coil, as shown in FIG. 2A. In accordance with another embodiment, the ripple detector may be coupled between ground and the secondary coil, as shown in FIGS. 2B and 2C. In accordance with another embodiment, the ripple detector may be coupled between ground and the primary coil, as shown in FIGS. 2D and 2E. In accordance with an embodiment, the ripple detector may be coupled in parallel to the primary coil, as shown in FIG. 2F. In accordance with another embodiment, the ripple detector may be coupled differentially between the primary coil and the secondary coil, as shown in FIGS. 2G and 2H.

The power combiner 106 may provide the output RF signal 126 to the Tx antenna 108. In accordance with an embodiment, the Tx antenna 108 may be a differential antenna, as shown and described for example, in FIGS. 2A-2H. In such a case, the differential antenna may receive the output RF signal 126, as expressed in the equation (4).

FIG. 2A illustrates a first exemplary embodiment of an outphasing power combiner, in accordance with an exemplary embodiment of the disclosure. FIG. 2A is described in conjunction with elements from FIG. 1. With reference to FIG. 2A, there is shown a portion of the outphasing RF Tx 100 that includes the first PA 104A, the second PA 104B, the power combiner 106, and a differential antenna 108A. The power combiner 106 may include a transformer 202, a load impedance 204, and a ripple detector 206. The transformer 202 may include a primary coil 202A and a secondary coil 202B. The primary coil 202A is coupled to the first PA 104A and the second PA 104B. The secondary coil 202B is coupled to the primary coil 202A on one side, and to the differential antenna 108A on the other side. The load impedance 204 is adjustable and coupled between a median point of the primary coil 202A and ground. The ripple detector 206 may be coupled in parallel to the secondary coil 202B.

With reference to FIG. 2A, the first PA 104A may receive the first constant-envelope signal 122A during the normal operation and generate the first amplified constant-envelope signal 124A. Similarly, the second PA 104B may receive the second constant-envelope signal 122B and generate the second amplified constant-envelope signal 124B. Based on the first amplified constant-envelope signal 124A, a first current $I_1$ may be generated across an output terminal of the first PA 104A. Similarly, based on the second amplified constant-envelope signal 124B, a second current $I_2$ may be generated across an output terminal of the second PA 104B.

In accordance with a first implementation of the first exemplary embodiment, the first current $I_1$ may be outphased with the second current $I_2$. In other words, a first phase of the first amplified constant-envelope signal 124A in the primary coil 202A is in the opposite direction with respect to a second phase of the second amplified constant-envelope signal 124B. In such a case, a current $I_3$ may be induced in the secondary coil 202B of the transformer 202. The secondary coil 202B may supply the current $I_3$ to the differential antenna 108A and no current may be dissipated in the load impedance 204.

In accordance with a second implementation of the first exemplary embodiment, the first current $I_1$ is in-phase with the second current $I_2$ (i.e., common mode implementation). In other words, the first phase of the first amplified constant-envelope signal 124A in the primary coil 202A is in the same direction with respect to the second phase of the second amplified constant-envelope signal 124B in the primary coil 202A. Thus, there is zero potential drop across the output terminals of the first PA 104A and the second PA 104B. In such a case, no current may be induced in the secondary coil 202B of the transformer 202. Thus, the secondary coil 202B may not supply any current to the differential antenna 108A. At the same time, there is zero potential drop across the output terminals of the first PA 104A and the second PA 104B and a terminal of the load impedance 204 connected to the primary coil 202A. In such a case, the current $I_3$ may be dissipated in the load impedance 204.

Due to incorrect impedance matching between the differential antenna 108A and the load impedance 204 (i.e., when the load impedance 204 is unbalanced), one or more ripples may be observed in the first amplified constant-envelope signal 124A and the second amplified constant-envelope signal 124B in the primary coil 202A. In other words, due to incorrect impedance matching between the differential antenna 108A and the load impedance 204, the one or more ripples may be observed at the first terminal and the second terminal of the primary coil 202A that receive the first amplified constant-envelope signal 124A and the second amplified constant-envelope signal 124B, respectively. The one or more ripples in the first amplified constant-envelope signal 124A and the second amplified constant-envelope signal 124B may further cause one or more ripples in the current $I_3$ that is supplied to the differential antenna 108A. Thus, the load impedance 204 is required to be matched with the impedance of the differential antenna 108A. In the first exemplary embodiment, the load impedance 204 may only be adjusted to match the impedance of the differential antenna 108A during a calibration phase of the power combiner 106.

In the calibration phase, a fixed tone signal may be supplied to the signal decomposition block 102, and the ripple detector 206 may be configured to detect the one or more ripples caused in the current $I_3$ that is induced in the secondary coil 202B due to supply of the fixed tone signal. For example, when the current $I_3$ has the one or more ripples, an output signal generated by the ripple detector 206 also has ripples; however, when the current $I_3$ has no ripples, the output signal generated by the ripple detector 206 is a direct current (DC) signal. In such a case, when there are one or more ripples observed in the current $I_3$, the load impedance 204 may be adjusted to match the impedance of the differential antenna 108A, till there are no more ripples observed in the current $I_3$. In one embodiment, the ripple detector 206 may be configured to provide the detected ripples to a controller (not shown), which may adjust the load impedance 204 to match the impedances of the differential antenna 108A, the first PA 104A, and the second PA 104B. Examples of the ripple detector 206 may include, but are not limited to, a TSSI, an envelope detector, or any electronic circuit that is capable of detecting ripples.

FIG. 2B illustrates a second exemplary embodiment of an outphasing power combiner, in accordance with an exemplary embodiment of the disclosure. FIG. 2B is described in conjunction with elements from FIGS. 1 and 2A. With reference to FIG. 2B, there is shown a portion of the outphasing RF Tx 100 (of FIG. 1) that includes the first PA 104A, the second PA 104B, the power combiner 106, and the differential antenna 108A. The power combiner 106 may include the transformer 202, the load impedance 204, and the ripple detector 206. The transformer 202 may include the primary coil 202A and the secondary coil 202B. The primary coil 202A is coupled to the first PA 104A and the second PA 104B. The secondary coil 202B is coupled to the primary coil 202A on one side, and to the differential antenna 108A on the other side. The load impedance 204 is adjustable and coupled between the median point of the primary coil 202A and ground. The ripple detector 206 may be coupled between a first terminal (for example, a positive terminal) of the secondary coil 202B and ground. The functionality of the first PA 104A, the second PA 104B, the primary coil 202A, the secondary coil 202B, the load impedance 204, the differential antenna 108A, and the ripple detector 206 of FIG. 2B is same as described in FIG. 2A.

FIG. 2C illustrates a third exemplary embodiment of an outphasing power combiner, in accordance with an exemplary embodiment of the disclosure. FIG. 2C is described in conjunction with elements from FIGS. 1, 2A, and 2B. With reference to FIG. 2C, there is shown a portion of the outphasing RF Tx 100 (of FIG. 1) that includes the first PA 104A, the second PA 104B, the power combiner 106, and the differential antenna 108A. The power combiner 106 may include the transformer 202, the load impedance 204, and the ripple detector 206. The transformer 202 may include the primary coil 202A and the secondary coil 202B. The primary coil 202A is coupled to the first PA 104A and the second PA 104B. The secondary coil 202B is coupled to the primary coil 202A on one side, and to the differential antenna 108A on the other side. The load impedance 204 is adjustable and coupled between the median point of the primary coil 202A and ground. The ripple detector 206 may be coupled between a second terminal (for example, a negative terminal) of the secondary coil 202B and ground. The functionality of the first PA 104A, the second PA 104B, the primary coil 202A, the secondary coil 202B, the load impedance 204, the differential antenna 108A, and the ripple detector 206 of FIG. 2C is same as described in FIG. 2A.

FIG. 2D illustrates a fourth exemplary embodiment of an outphasing power combiner, in accordance with an exemplary embodiment of the disclosure. FIG. 2D is described in conjunction with elements from FIGS. 1, 2A, 2B, and 2C. With reference to FIG. 2D, there is shown a portion of the outphasing RF Tx 100 (of FIG. 1) that includes the first PA 104A, the second PA 104B, the power combiner 106, and the differential antenna 108A. The power combiner 106 may include the transformer 202, the load impedance 204, and the ripple detector 206. The transformer 202 may include the primary coil 202A and the secondary coil 202B. The primary coil 202A is coupled to the first PA 104A and the second PA 104B. The secondary coil 202B is coupled to the primary coil 202A on one side, and to the differential antenna 108A on the other side. The load impedance 204 is adjustable and coupled between the median point of the primary coil 202A and ground. The ripple detector 206 may be coupled between a first terminal (for example, a positive terminal) of the primary coil 202A and ground. The functionality of the first PA 104A, the second PA 104B, the primary coil 202A, the secondary coil 202B, the load impedance 204, and the differential antenna 108A of FIG. 2D is same as described in FIG. 2A.

In the fourth exemplary embodiment, the load impedance 204 may be adjusted to match the impedance of the differential antenna 108A during the calibration phase as described in FIG. 2A or during the normal operation of the power combiner 106. During the normal operation of the power combiner 106, the modulated input signal 116 may be supplied to the signal decomposition block 102. The ripple detector 206 may be configured to detect one or more ripples caused in the first amplified constant-envelope signal 124A at the first terminal of the primary coil 202A. For example, when there are one or more ripples at the first terminal of the primary coil 202A, the output signal generated by the ripple detector 206 also has ripples; however, when there are no ripples at the first terminal of the primary coil 202A, the output signal generated by the ripple detector 206 is a DC signal. In such a case, when there are ripples observed at the first terminal of the primary coil 202A, the load impedance 204 may be adjusted to match the impedance of the differential antenna 108A, till there are no more ripples observed at the first terminal of the primary coil 202A. In one embodiment, the ripple detector 206 may be configured to provide the detected ripples to the controller, which may adjust the load impedance 204 to match the impedances of the differential antenna 108A, the first PA 104A, and the second PA 104B.

FIG. 2E illustrates a fifth exemplary embodiment of an outphasing power combiner, in accordance with an exemplary embodiment of the disclosure. FIG. 2E is described in conjunction with elements from FIGS. 1, and 2A to 2D. With reference to FIG. 2E, there is shown a portion of the outphasing RF Tx 100 (of FIG. 1) that includes the first PA 104A, the second PA 104B, the power combiner 106, and the differential antenna 108A. The power combiner 106 may include the transformer 202, the load impedance 204, and the ripple detector 206. The transformer 202 may include the primary coil 202A and the secondary coil 202B. The primary coil 202A is coupled to the first PA 104A and the second PA 104B. The secondary coil 202B is coupled to the primary coil 202A on one side, and to the differential antenna 108A on the other side. The load impedance 204 is adjustable and coupled between the median point of the primary coil 202A and ground. The ripple detector 206 may be coupled between a second terminal (for example, a negative terminal) of the primary coil 202A and ground. The functionality of the first PA 104A, the second PA 104B, the primary coil 202A, the secondary coil 202B, the load impedance 204, and the differential antenna 108A of FIG. 2E is same as described in FIG. 2A.

In the fifth exemplary embodiment, the load impedance 204 may be adjusted to match the impedance of the differential antenna 108A during the calibration phase as described in FIG. 2A or during the normal operation of the power combiner 106. During the normal operation of the power combiner 106, the modulated input signal 116 may be supplied to the signal decomposition block 102. The ripple detector 206 may be configured to detect one or more ripples caused in the second amplified constant-envelope signal 124B at the second terminal of the primary coil 202A. For example, when there are one or more ripples at the second terminal of the primary coil 202A, the output signal generated by the ripple detector 206 also has ripples; however, when there are no ripples at the second terminal of the primary coil 202A, the output signal generated by the ripple detector 206 is a DC signal. In such a case, when there are ripples observed at the second terminal of the primary coil 202A, the load impedance 204 may be adjusted to match the impedance of the differential antenna 108A, till there are no more ripples observed at the second terminal of the primary coil 202A. In one embodiment, the ripple detector 206 may be configured to provide the detected ripples to the controller, which may adjust the load impedance 204 to match the impedances of the differential antenna 108A, the first PA 104A, and the second PA 104B.

FIG. 2F illustrates a sixth exemplary embodiment of an outphasing power combiner, in accordance with an exemplary embodiment of the disclosure. FIG. 2F is described in conjunction with elements from FIGS. 1, and 2A to 2E. With reference to FIG. 2F, there is shown a portion of the outphasing RF Tx 100 (of FIG. 1) that includes the first PA 104A, the second PA 104B, the power combiner 106, and the differential antenna 108A. The power combiner 106 may include the transformer 202, the load impedance 204, and the ripple detector 206. The transformer 202 may include the primary coil 202A and the secondary coil 202B. The primary coil 202A is coupled to the first PA 104A and the second PA 104B. The secondary coil 202B is coupled to the primary coil 202A on one side, and to the differential antenna 108A on the other side. The load impedance 204 is adjustable and coupled between the median point of the primary coil 202A and ground. The ripple detector 206 may be coupled in parallel to the primary coil 202A. The functionality of the first PA 104A, the second PA 104B, the primary coil 202A, the secondary coil 202B, the load impedance 204, and the differential antenna 108A of FIG. 2F is same as described in FIG. 2A.

In the sixth exemplary embodiment, the load impedance 204 may be adjusted to match the impedance of the differential antenna 108A during the calibration phase as described in FIG. 2A or during the normal operation of the power combiner 106. During the normal operation of the power combiner 106, the modulated input signal 116 may be supplied to the signal decomposition block 102. The ripple detector 206 may be configured to detect one or more ripples caused in the first amplified constant-envelope signal 124A or the second amplified constant-envelope signal 124B at the two terminals of the primary coil 202A. For example, when there are ripples at any of the two terminals of the primary coil 202A, the output signal generated by the ripple detector 206 also has ripples; however, when there are no ripples at the two terminals of the primary coil 202A, the output signal generated by the ripple detector 206 is a DC signal. In such a case, when there are ripples observed at any of the two terminals of the primary coil 202A, the load impedance 204 may be adjusted to match the impedance of the differential antenna 108A, till there are no more ripples observed at the two terminals of the primary coil 202A. In one embodiment, the ripple detector 206 may be configured to provide the detected ripples to the controller, which may adjust the load impedance 204 to match the impedances of the differential antenna 108A, the first PA 104A, and the second PA 104B.

FIG. 2G illustrates a seventh exemplary embodiment of an outphasing power combiner. FIG. 2G is described in conjunction with elements from FIGS. 1, and 2A to 2F. With reference to FIG. 2G, there is shown a portion of the outphasing RF Tx 100 that includes the first PA 104A, the second PA 104B, the power combiner 106, and the differential antenna 108A. The power combiner 106 may include the transformer 202, the load impedance 204, and the ripple detector 206. The transformer 202 may include the primary coil 202A and the secondary coil 202B. The primary coil 202A is coupled to the first PA 104A and the second PA 104B. The secondary coil 202B is coupled to the primary coil 202A on one side, and to the differential antenna 108A on the other side. The load impedance 204 is adjustable and coupled between the median point of the primary coil 202A and ground. The ripple detector 206 may be coupled differentially between the primary coil 202A and the secondary coil 202B. For example, a first terminal of the ripple detector 206 may be coupled to the first terminal (i.e., the positive terminal) of the primary coil 202A and a second terminal of the ripple detector 206 may be coupled to the second terminal (i.e., the negative terminal) of the secondary coil 202B. The functionality of the first PA 104A, the second PA 104B, the primary coil 202A, the secondary coil 202B, the load impedance 204, the differential antenna 108A and the ripple detector 206 of FIG. 2G is same as described in FIG. 2A. In the seventh exemplary embodiment, the load impedance 204 may be adjusted to match the impedance of the differential antenna 108A only during the calibration phase as described in FIG. 2A.

FIG. 2H illustrates an eighth exemplary embodiment of an outphasing power combiner. FIG. 2G is described in conjunction with elements from FIGS. 1, and 2A to 2G. With reference to FIG. 2H, there is shown a portion of the outphasing RF Tx 100 that includes the first PA 104A, the second PA 104B, the power combiner 106, and the differential antenna 108A. The power combiner 106 may include the transformer 202, the load impedance 204, and the ripple detector 206. The transformer 202 may include the primary coil 202A and the secondary coil 202B. The primary coil 202A is coupled to the first PA 104A and the second PA 104B. The secondary coil 202B is coupled to the primary coil 202A on one side, and to the differential antenna 108A on the other side. The load impedance 204 is adjustable and coupled between the median point of the primary coil 202A and ground. The ripple detector 206 may be coupled differentially between the primary coil 202A and the secondary coil 202B. For example, the first terminal of the ripple detector 206 may be coupled to the second terminal (i.e., the negative terminal) of the primary coil 202A and the second terminal of the ripple detector 206 may be coupled to the first terminal (i.e., the positive terminal) of the secondary coil 202B. The functionality of the first PA 104A, the second PA 104B, the primary coil 202A, the secondary coil 202B, the load impedance 204, the differential antenna 108A, and the ripple detector 206 of FIG. 2H is same as described in FIG. 2A. In the eighth exemplary embodiment, the load impedance 204 may be adjusted to match the impedance of the differential antenna 108A only during the calibration phase as described in FIG. 2A.

Since the power combiner 106 (as shown in FIGS. 2A-2H) does not require any dummy load to be connected in parallel to the primary coil 202A, no power is lost within the power combiner 106 due to the different phases of the two amplified constant-envelope signals 124A and 124B. Thus, the power efficiency of the power combiner 106 is improved in comparison to the conventional power combiners that utilize the dummy load. In portable device applications (such as in cell phones, or the like), a higher power efficiency may result in longer battery life and/or smaller battery size. Reduction in the battery size may in turn result in a reduction in the size of the portable devices. Further, the power combiner 106 is an isolating power combiner. Thus, the first PA 104A and the second PA 104B that feed the power combiner 106 do not interfere with each other, resulting in higher linearity of the first PA 104A and the second PA 104B than PAs in non-isolating power combiner. Such high linearity results in higher possible data rates and higher spectral and power efficiency, which is a basic requirement for the present wireless communication standards such as 802.11 Wireless LAN, cellular LTE, and 5G. In other words, since the RF Tx 100 utilizes the power combiner 106 which is both linear and efficient, the RF Tx 100 satisfies the demand for both greater transmission rates and smaller devices.

While various embodiments described in the present disclosure have been described above, it should be understood that they have been presented by way of example, and not limitation. It is to be understood that various changes in form and detail can be made therein without departing from the scope of the present disclosure. In addition to using hardware (e.g., within or coupled to a central processing unit ("CPU" or processor), microprocessor, micro controller, digital signal processor, processor core, system on chip ("SOC") or any other device), implementations may also be embodied in software (e.g. computer readable code, program code, and/or instructions disposed in any form, such as source, object or machine language) disposed for example in a non-transitory computer-readable medium configured to store the software. Such software can enable, for example, the function, fabrication, modeling, simulation, description and/or testing of the apparatus and methods describe herein. For example, this can be accomplished through the use of general program languages (e.g., C, C++), hardware description languages (HDL) including Verilog HDL, VHDL, and so on, or other available programs. Such software can be disposed in any known non-transitory computer-readable medium, such as semiconductor, magnetic disc, or optical disc (e.g., CD-ROM, DVD-ROM, etc.). The software can also be disposed as computer data embodied in a non-transitory computer-readable transmission medium (e.g., solid state memory any other non-transitory medium including digital, optical, analogue-based medium, such as removable storage media). Embodiments of the present disclosure may include methods of providing the apparatus described herein by providing software describing the apparatus and subsequently transmitting the software as a computer data signal over a communication network including the internet and intranets.

It is to be further understood that the system described herein may be included in a semiconductor intellectual property core, such as a microprocessor core (e.g., embodied in HDL) and transformed to hardware in the production of integrated circuits. Additionally, the system described herein may be embodied as a combination of hardware and software. Thus, the present disclosure should not be limited by any of the above-described exemplary embodiments, but should be defined only in accordance with the following claims and their equivalents.

What is claimed is:

1. An power combiner circuit, comprising:
a transformer that includes a primary coil and a secondary coil, wherein the primary coil is coupled to a first power amplifier (PA) and a second PA, and
wherein the secondary coil is configured to supply a current to a differential antenna based on a first direction of a first phase of a first amplified constant-envelope signal in the primary coil with respect to a second phase of a second amplified constant-envelope signal in the primary coil;
a ripple detector coupled to the primary coil, wherein the ripple detector is configured to detect at least one ripple in the current; and
a load impedance coupled between a median point of the primary coil and ground,
wherein the load impedance is adjusted to match the impedance of the differential antenna based on the detection of the at least one ripple in the current,
wherein the load impedance dissipates the current based on a second direction of the first phase of the first amplified constant-envelope signal in the primary coil with respect to the second phase of the second amplified constant-envelope signal in the primary coil, and
wherein the second direction of the first phase of the first amplified constant-envelope signal is different from the first direction of the first phase of the first amplified constant-envelope signal in the primary coil.

2. The power combiner circuit of claim 1, wherein the primary coil of the transformer is coupled in parallel with the secondary coil of the transformer.

3. The power combiner circuit of claim 1, wherein the first amplified constant-envelope signal is generated by the first PA based on a first constant-envelope signal, wherein the second amplified constant-envelope signal is generated by the second PA based on a second constant-envelope signal, and wherein the first constant-envelope signal is received by the first PA and the second constant-envelope signal is received by the second PA, from a signal decomposition block.

4. The power combiner circuit of claim 3, wherein the first constant-envelope signal and the second constant-envelope signal are generated by the signal decomposition block based on a modulated input signal.

5. The power combiner circuit of claim 4, wherein the modulated input signal is a variable amplitude modulated signal, wherein the first constant-envelope signal and the second constant-envelope signal are constant amplitude decomposed RF signals with corresponding phases in opposite direction.

6. The power combiner circuit of claim 1, wherein the load impedance is adjustable, and wherein the load impedance is adjusted to match an impedance of the differential antenna based on detection of one or more ripples at the primary coil or in the current supplied to the differential antenna.

7. The power combiner circuit of claim 6, further comprising a ripple detector coupled to the transformer to detect the one or more ripples at the primary coil or in the current supplied to the differential antenna.

8. The power combiner circuit of claim 7, wherein the ripple detector is coupled in parallel to the secondary coil.

9. The power combiner circuit of claim 7, wherein the ripple detector is coupled between ground and one of the primary coil or the secondary coil.

10. The power combiner circuit of claim 7, wherein the ripple detector is coupled differentially between the primary coil and the secondary coil.

11. A radio frequency (RF) transmitter, comprising:
a first power amplifier (PA) and a second PA, wherein the first PA is configured to generate a first amplified constant-envelope signal based on a first constant-envelope signal, and wherein the second PA is configured to generate a second amplified constant-envelope signal based on a second constant-envelope signal;
a power combiner configured to combine the first amplified constant-envelope signal and the second amplified constant-envelope signal, the power combiner comprising:
a transformer that includes a primary coil and a secondary coil,
wherein the primary coil is coupled to the first PA and the second PA, and
wherein the secondary coil is configured to supply a current based on a first direction of a first phase of the first amplified constant-envelope signal in the primary coil with respect to a second phase of the second amplified constant-envelope signal in the primary coil;
a ripple detector coupled to the primary coil, wherein the ripple detector is configured to detect at least one ripple in the current; and
a load impedance coupled between a median point of the primary coil and ground,
wherein the load impedance is adjusted to match the impedance of a differential antenna based on the detection of the at least one ripple in the current,
wherein the load impedance dissipates the current based on a second direction of the first phase of the first amplified constant-envelope signal with respect to the second phase of the second amplified constant-envelope signal, and
wherein the second direction of the first phase of the first amplified constant-envelope signal is different from the first direction of the first phase of the first amplified constant-envelope signal in the primary coil; and the differential antenna configured to receive the current supplied by the secondary coil of the transformer and transmit an output RF signal to a RF receiver, wherein the transmitted output RF signal corresponds to a combination of the first amplified constant-envelope signal and the second amplified constant-envelope signal.

12. The RF transmitter of claim 11, further comprising a signal decomposition block configured to decompose a modulated input signal into the first constant-envelope signal and the second constant-envelope signal.

13. The RF transmitter of claim 12, wherein the modulated input signal is a variable amplitude modulated signal, and wherein the first constant-envelope signal and the second constant-envelope signal are constant amplitude decomposed RF signals with corresponding phases in opposite direction.

14. The RF transmitter of claim 11, wherein the primary coil of the transformer is coupled in parallel to the secondary coil of the transformer.

15. The RF transmitter of claim 11, wherein the load impedance is adjustable, and wherein the load impedance is adjusted to match an impedance of the differential antenna based on detection of one or more ripples at the primary coil or in the current supplied to the differential antenna.

16. The RF transmitter of claim 15, wherein the power combiner further comprises a ripple detector coupled to the transformer to detect the one or more ripples at the primary coil or in the current supplied to the differential antenna.

17. The RF transmitter of claim 16, wherein the ripple detector is coupled in parallel to the secondary coil.

18. The RF transmitter of claim 16, wherein the ripple detector is coupled between ground and one of the primary coil or the secondary coil.

19. The RF transmitter of claim 16, wherein the ripple detector is coupled differentially between the primary coil and the secondary coil.

20. A power combiner circuit, comprising:
a transformer that includes a primary coil and a secondary coil, wherein the primary coil is coupled to a first power amplifier (PA) and a second PA, and
wherein the secondary coil is configured to supply a current to an antenna based on a first direction of a first phase of a first amplified constant-envelope signal in the primary coil with respect to a second phase of a second amplified constant-envelope signal in the primary coil;
a load impedance coupled between a median point of the primary coil and ground,
wherein the load impedance dissipates the current based on a second direction of the first phase of the first amplified constant-envelope signal in the primary coil with respect to the second phase of the second amplified constant-envelope signal in the primary coil,
wherein the load impedance is adjustable, and
wherein the load impedance is adjusted to match an impedance of the antenna based on detection of one or more ripples at the primary coil or in the current supplied to the antenna.

21. A power combiner circuit, comprising:
a transformer that includes a primary coil and a secondary coil, wherein the primary coil is coupled to a first power amplifier (PA) and a second PA, and wherein the secondary coil is configured to supply a current to an antenna based on a first direction of a first phase of a first amplified constant-envelope signal in the primary coil with respect to a second phase of a second amplified constant-envelope signal in the primary coil;
a load impedance coupled between a median point of the primary coil and ground,
wherein the load impedance dissipates the current based on a second direction of the first phase of the first amplified constant-envelope signal in the primary coil with respect to the second phase of the second amplified constant-envelope signal in the primary coil; and
a ripple detector coupled to the transformer to detect one or more ripples at the primary coil or in the current supplied to the antenna, wherein the load impedance is adjusted until the ripple detector generates a direct current (DC) signal.

22. The power combiner circuit of claim 21, wherein the ripple detector is coupled in parallel to the secondary coil.

23. The power combiner circuit of claim 21, wherein the ripple detector is coupled between ground and one of the primary coil or the secondary coil.

24. The power combiner circuit of claim 21, wherein the ripple detector is coupled differentially between the primary coil and the secondary coil.

25. A radio frequency (RF) transmitter, comprising:
a first power amplifier (PA) and a second PA, wherein the first PA is configured to generate a first amplified constant-envelope signal based on a first constant-envelope signal, and wherein the second PA is configured to generate a second amplified constant-envelope signal based on a second constant-envelope signal;
a power combiner configured to combine the first amplified constant-envelope signal and the second amplified constant-envelope signal, the power combiner comprising:
a transformer that includes a primary coil and a secondary coil, wherein the primary coil is coupled to the first PA and the second PA, and wherein the secondary coil is configured to supply a current based on a first direction of a first phase of the first amplified constant-envelope signal in the primary coil with respect to a second phase of the second amplified constant-envelope signal in the primary coil;
a load impedance coupled between a median point of the primary coil and ground, wherein the load impedance dissipates the current based on the first phase of the first amplified constant-envelope signal being same as the second phase of the second amplified constant-envelope signal; and
a ripple detector coupled to the transformer to detect one or more ripples at the primary coil or in the current supplied to an antenna; and
the antenna configured to receive the current supplied by the secondary coil of the transformer and transmit an output RF signal to a RF receiver, wherein the transmitted output RF signal corresponds to a combination of the first amplified constant-envelope signal and the second amplified constant-envelope signal.

26. The RF transmitter of claim 25, wherein the ripple detector is coupled in parallel to the secondary coil.

27. The RF transmitter of claim 25, wherein the ripple detector is coupled between ground and one of the primary coil or the secondary coil.

28. The RF transmitter of claim 25, wherein the ripple detector is coupled differentially between the primary coil and the secondary coil.

29. A radio frequency (RF) transmitter, comprising:

a first power amplifier (PA) and a second PA, wherein the first PA is configured to generate a first amplified constant-envelope signal based on a first constant-envelope signal, and wherein the second PA is configured to generate a second amplified constant-envelope signal based on a second constant-envelope signal;

a power combiner configured to combine the first amplified constant-envelope signal and the second amplified constant-envelope signal, the power combiner comprising:

a transformer that includes a primary coil and a secondary coil, wherein the primary coil is coupled to the first PA and the second PA, and wherein the secondary coil is configured to supply a current based on a first direction of a first phase of the first amplified constant-envelope signal in the primary coil with respect to a second phase of the second amplified constant-envelope signal in the primary coil;

a load impedance coupled between a median point of the primary coil and ground, wherein the load impedance dissipates the current based on a second direction of the first phase of the first amplified constant-envelope signal with respect to the second phase of the second amplified constant-envelope signal, wherein the load impedance is adjustable, and wherein the load impedance is adjusted to match an impedance of an antenna based on detection of one or more ripples at the primary coil or in the current supplied to the antenna; and the antenna configured to receive the current supplied by the secondary coil of the transformer and transmit an output RF signal to a RF receiver, wherein the transmitted output RF signal corresponds to a combination of the first amplified constant-envelope signal and the second amplified constant-envelope signal.

* * * * *